United States Patent
Taneda et al.

(10) Patent No.: US 9,401,261 B2
(45) Date of Patent: Jul. 26, 2016

(54) OZONE SUPPLYING APPARATUS, OZONE SUPPLYING METHOD, AND CHARGED PARTICLE BEAM DRAWING SYSTEM

(71) Applicant: NuFlare Technology, Inc., Yokohama-shi (JP)

(72) Inventors: Yasuyuki Taneda, Tokyo (JP); Yoshiro Yamanaka, Kanagawa-ken (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/852,699

(22) Filed: Sep. 14, 2015

(65) Prior Publication Data
US 2016/0086768 A1  Mar. 24, 2016

(30) Foreign Application Priority Data

Sep. 19, 2014  (JP) .................. 2014-191018
Sep. 1, 2015   (JP) .................. 2015-171781

(51) Int. Cl.
| H01J 37/30  | (2006.01) |
| B01J 19/08  | (2006.01) |
| H01J 37/317 | (2006.01) |
| H01J 37/04  | (2006.01) |
| H01J 37/147 | (2006.01) |

(52) U.S. Cl.
CPC ........... *H01J 37/3002* (2013.01); *B01J 19/087* (2013.01); *H01J 37/045* (2013.01); *H01J 37/147* (2013.01); *H01J 37/3174* (2013.01); *B01J 2219/0801* (2013.01); *B01J 2219/085* (2013.01); *B01J 2219/0869* (2013.01); *B01J 2219/0875* (2013.01); *H01J 2237/043* (2013.01); *H01J 2237/15* (2013.01); *H01J 2237/3173* (2013.01)

(58) Field of Classification Search
USPC .......................... 250/306, 307, 492.2, 441.11
See application file for complete search history.

(56) References Cited

U.S. PATENT DOCUMENTS

2010/0009079 A1* 1/2010 Yamazaki ............. C23C 16/405
                                                        427/255.28

* cited by examiner

*Primary Examiner* — Kiet T Nguyen
(74) *Attorney, Agent, or Firm* — Oblon, McClelland, Maier & Neustadt, L.L.P.

(57) ABSTRACT

An ozone supplying apparatus according to an embodiment of the present invention is an ozone gas supplying apparatus which supplies an ozone gas to a vacuum apparatus. The ozone supplying apparatus includes an ozone generator configured to generate the ozone gas, a first flow controller configured to control a flow rate of the ozone gas generated by the ozone generator, a second flow controller configured to control a flow rate of the ozone gas supplied to the vacuum apparatus, and a main pipe provided on a secondary side of the first flow controller and on a primary side of the second flow controller, with the ozone gas being introduced into the main pipe at such a flow rate that an internal pressure of the main pipe is controlled to be lower than atmospheric pressure by the first flow controller.

14 Claims, 11 Drawing Sheets

OZONE SUPPLYING APPARATUS, OZONE SUPPLYING METHOD, AND CHARGED PARTICLE BEAM DRAWING SYSTEM

CROSS REFERENCE TO RELATED APPLICATIONS

This application is based upon and claims the benefit of priority from the prior Japanese Patent Application No. 2014-191018 filed in Japan on Sep. 19, 2014, and the prior Japanese Patent Application No. 2015-171781 filed in Japan on Sep. 1, 2015; the entire contents of which are incorporated herein by reference.

FIELD

The present invention relates to an ozone supplying apparatus, an ozone supplying method, and a charged particle beam drawing system.

BACKGROUND

Recent increase in integration and capacity of large-scale integration (LSI) circuits require further miniaturization of semiconductor devices. In the lithography technique to form a desired circuit pattern on a semiconductor device, pattern transfer is performed using an original pattern referred to as a mask (reticle). To produce a high accuracy mask used in the pattern transfer, a charged particle beam drawing apparatus which has excellent resolution and uses an electron beam is used.

In the charged particle beam drawing apparatus, the charged particle beam is formed and deflected using a plurality of electrodes in a charged particle optical system, while a stage, on which an object such as a mask is supported, is moved, and the object is then irradiated with the obtained charged particle beam. Thus, a predetermined pattern is drawn on the object on the stage.

If, however, charging and contamination of the electrodes used in forming and deflecting such a charged particle beam occur, there arises a problem that a drawing accuracy is deteriorated. To solve this problem, ozone gas is supplied to the drawing apparatus for cleaning. The ozone gas is generated by an ozone generator and supplied to the drawing apparatus through a pipe.

The ozone generator, which generates the ozone gas, is configured to vibrate and generate a magnetic field. The generated vibration and magnetic field become factors to decrease a drawing accuracy of the drawing apparatus. Usually, therefore, the ozone generator is disposed at a position apart from the drawing apparatus far enough to ignore the decrease of the drawing accuracy due to the vibration and magnetic field. As a result, a longer pipe is needed to connect the ozone generator with the drawing apparatus. As the length of the pipe and stay-time of the ozone gas in the pipe become longer, the ozone gas is decomposed in the pipe and converted into oxygen. Thus, it has been difficult to supply a high concentration ozone gas to the drawing apparatus.

DESCRIPTION OF THE EMBODIMENTS

An ozone supplying apparatus according to an embodiment of the present invention is an ozone gas supplying apparatus which supplies an ozone gas to a vacuum apparatus. The ozone supplying apparatus includes an ozone generator configured to generate the ozone gas, a first flow controller configured to control a flow rate of the ozone gas generated by the ozone generator, a second flow controller configured to control a flow rate of the ozone gas supplied to the vacuum apparatus, and a main pipe provided on a secondary side of the first flow controller and on a primary side of the second flow controller, with the ozone gas being introduced into the main pipe at such a flow rate that an internal pressure of the main pipe is controlled to be lower than atmospheric pressure by the first flow controller.

An ozone supplying method according to the embodiment of the present invention includes generating ozone gas, introducing the generated ozone gas into a main pipe by controlling a flow rate of the generated ozone gas such that an internal pressure of the main pipe is lower than atmospheric pressure, and supplying, to a vacuum apparatus, at least part of the ozone gas introduced into the main pipe by controlling the flow rate of the ozone gas.

A charged particle beam drawing system according to the embodiment of the present invention includes a drawing apparatus irradiating an object with a charged particle beam, and an ozone supplying apparatus that is connected to the drawing apparatus and the ozone supplying apparatus configured to supply ozone gas to the drawing apparatus. The ozone supplying apparatus includes an ozone generator configured to generate the ozone gas, a first flow controller configured to control a flow rate of the ozone gas generated by the ozone generator, a second flow controller configured to control the flow rate of the ozone gas supplied to the drawing apparatus, and a main pipe provided on a secondary side of the first flow controller and on a primary side of the second flow controller, with the ozone gas being introduced into the main pipe at such a flow rate that an internal pressure of the main pipe is controlled to be lower than atmospheric pressure by the first flow controller.

The ozone supplying apparatus, the ozone supplying method, and the charged particle beam drawing system according to embodiments of the present invention will be described below by referring to the accompanying drawings.

<First Embodiment>

Figure 1:
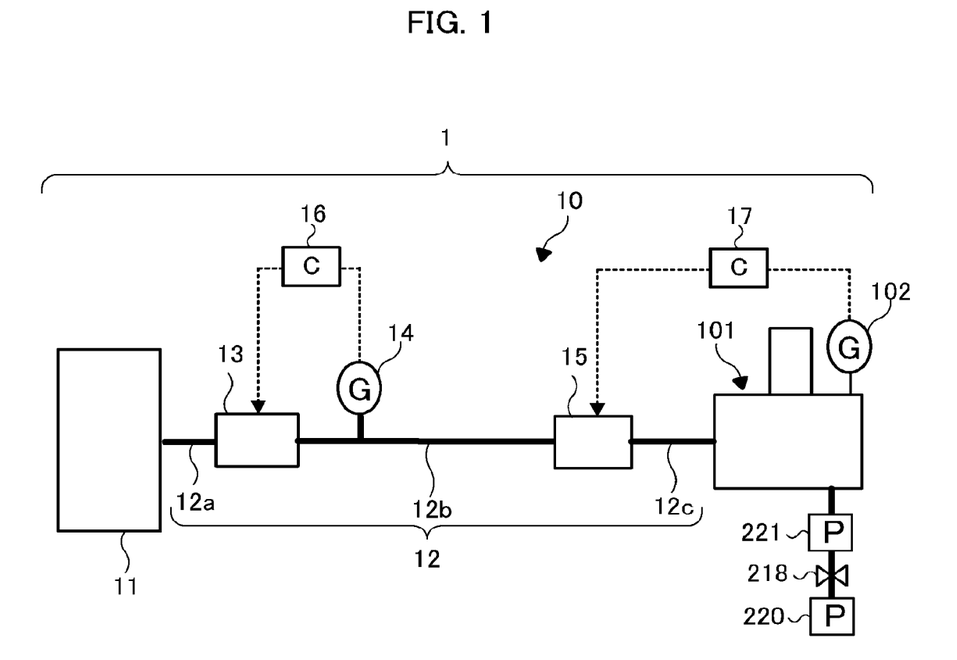
FIG. 1 is a schematic diagram illustrating the structure of a charged particle beam drawing system according to a first embodiment.

FIG. 1 is a schematic diagram illustrating the structure of a charged particle beam drawing system according to a first embodiment. A charged particle beam drawing system 1 illustrated in FIG. 1 includes an ozone supplying apparatus 10, according to the first embodiment, and a drawing apparatus 101. The drawing apparatus 101 is an example of a vacuum apparatus and is connected to the ozone supplying apparatus 10.

The ozone supplying apparatus 10 illustrated in FIG. 1 mainly includes an ozone generator 11 and main pipes 12 that connect the ozone generator 11 to the drawing apparatus 101.

The ozone generator 11 generates ozone gas and supply the generated ozone gas at a high pressure to near atmospheric pressure. The ozone generator 11 is disposed at a position apart from the drawing apparatus 101 by more than a predetermined distance in order to suppress the decrease of drawing accuracy of the drawing apparatus 101 due to vibrations and a magnetic field generated by the ozone generator 11.

Main pipes 12a, 12b, and 12c form a flow path of ozone gas to supply the ozone gas generated in the ozone generator 11 to the drawing apparatus 101. An upstream-side end portion of the main pipe 12a is connected to the ozone generator 11, and a downstream-side end portion of the main pipe 12c can be connected to the drawing apparatus 101. The main pipes 12 may have, for example, a capacity of 1,000 cc and a pressure loss of about 5 to 15%.

In the ozone supplying apparatus 10, a first mass flow controller 13, which is a first flow control mechanism, is provided on the upstream side of the main pipe 12b together with a pressure gauge 14 that detects the internal pressure of the main pipe 12b. The first mass flow controller 13 may have, for example, an internal valve. The valve is controlled by a controller 16 according to the pressure (primary pressure) in the main pipe 12b detected by the pressure gauge 14, thereby control the flow rate of the ozone gas discharged from the first mass flow controller 13. Incidentally, the controller 16 can also be made of processor, for example, an application specific integrated circuit (ASIC), a circuit device such as a programmable logic device, or the like. In the present embodiment, the first mass flow controller 13 controls the flow rate of the ozone gas in such a manner that a pressure in the main pipe 12b is a constant pressure at least lower than atmospheric pressure. Specifically, the first mass flow controller 13 controls the flow rate of the ozone gas to be constant within a range of 1 to $10^5$ Pa in the main pipe 12b.

A second mass flow controller 15, which is a second flow control mechanism, is provided on the downstream side of the main pipe 12b. The second mass flow controller 15 controls the flow rate of the ozone gas in the main pipe 12b, which is disposed on the primary side of the second mass flow controller 15, to be supplied to the drawing apparatus 101 at a constant flow rate. The second mass flow controller 15 may also have, for example, an internal valve. The valve is controlled by a controller 17 according to a detection result of a pressure gauge 102 attached to the drawing apparatus 101, thereby control the flow rate of the ozone gas discharged from the second mass flow controller 15. Incidentally, the controller 17 can also be made of processor, for example, ASIC, a circuit device such as a programmable logic device, or the like.

Figure 2:
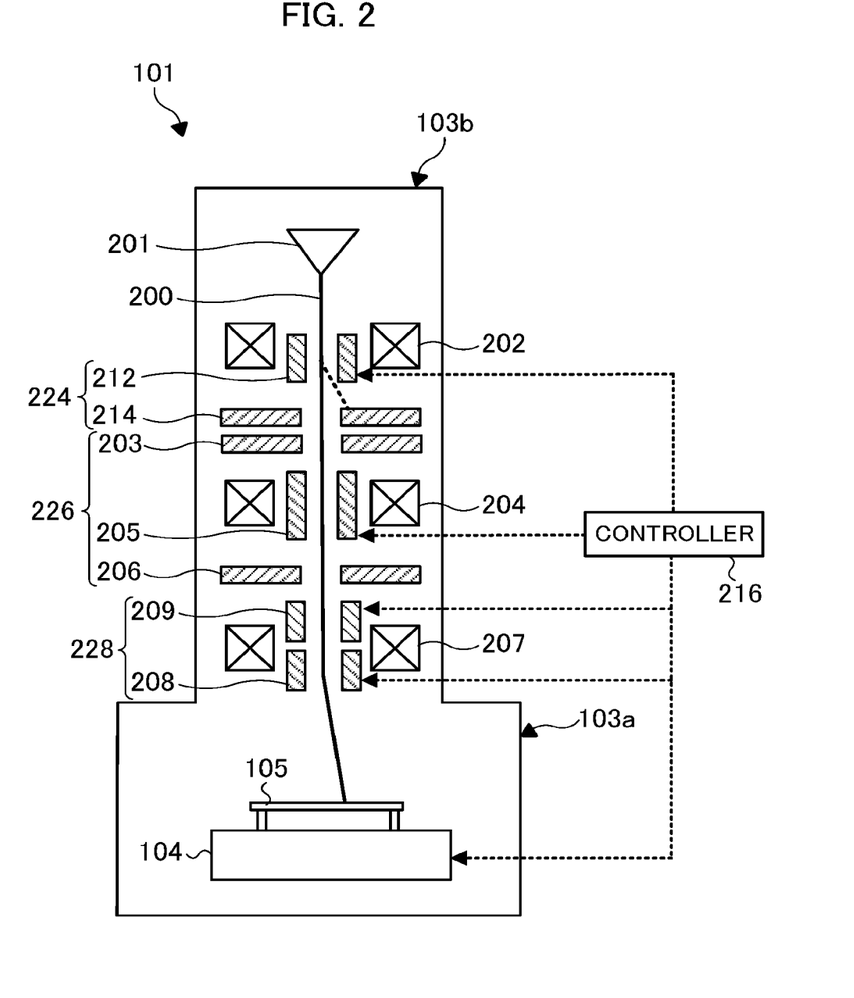
FIG. 2 is a schematic diagram illustrating a concept of a drawing apparatus.

FIG. 2 is a schematic diagram illustrating a concept of the drawing apparatus. As illustrated in FIG. 2, the drawing apparatus 101 includes a drawing chamber 103a and an electronic lens barrel 103b.

An XY stage 104 is disposed in the drawing chamber 103a. An object 105, which is subjected to drawing, is mounted on the XY stage 104, and the position of the object 105 can be controlled at constant speed or variable speed. The object 105 is an exposure mask used in manufacturing semiconductor devices for example. The object 105 is a mask blank on which nothing is drawn for example. The mask blank is formed by applying resist on a glass plate.

In the electronic lens barrel 103b, an electron gun 201, an illumination lens 202, a blanking deflector 212, a blanking aperture 214, a first aperture 203, a projection lens 204, a shaping deflector 205, a second aperture 206, an objective lens 207, a main deflector 208, and a sub-deflector 209 are provided. A controller 216 is connected to the blanking deflector 212, the shaping deflector 205, the main deflector 208, and the sub-deflector 209 of the electronic lens barrel 103b. The controller 216 supplies desired voltage signals to the deflectors 212, 205, 208, and 209.

The blanking deflector 212 and the blanking aperture 214 located below the deflector 212 form a blanking control mechanism 224 that controls turn-on/off of a charged particle beam 200, i.e., an irradiation time period (shot time period) and irradiation timing (shot timing) toward the object 105.

The first aperture 203 located below the blanking aperture 214, the shaping deflector 205 located below the first aperture 203, and the second aperture 206 located below the shaping deflector 205 form a shaping control mechanism 226 to shape the charged particle beam 200 into a desired shape.

The sub-deflector 209 located below the second aperture 206, and the main deflector 208 located below the sub-deflector 209 form an irradiation position control mechanism 228 that controls the irradiation position of the charged particle beam 200. The drawing position of the shaped charged particle beam 200 on the object 105 is controlled by controlling the main deflector 208 and the sub-deflector 209 using the controller 216, and controlling the position of the XY stage 104 using the controller 216.

As described above, the electronic lens barrel 103b is able to irradiate the desired position on the object 105 only for a desired period of time with the charged particle beam 200 that has been shaped into the desired shape. The electronic lens barrel is not limited for the use in single-beam irradiation, but multi-beam irradiation performed by controlling multiple beams may be used.

Meanwhile, a vacuum apparatus exhaust provided as a second exhaust is provided with the drawing apparatus 101. The vacuum apparatus exhaust evacuates the drawing apparatus 101. In the vacuum apparatus exhaust, an auxiliary dry pump 220 is connected to the rear stage of a high vacuum pump 221 via a valve 218.

A charged particle beam drawing method using the charged particle beam drawing system 1 according to the first embodiment will be described below by referring to FIG. 3. Another charged particle beam drawing method using a charged particle beam drawing system 1' (FIG. 4) according to a variation of the first embodiment is similar to the charged particle beam drawing method according to the first embodiment.

Figure 3:
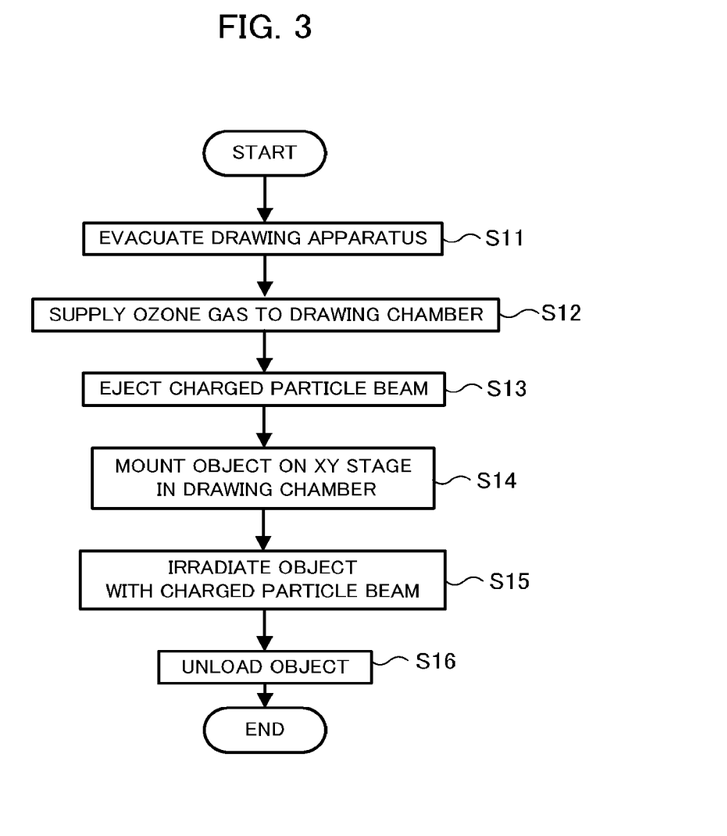
FIG. 3 is a flowchart illustrating a charged particle beam drawing method according to the first embodiment.

FIG. 3 is a flowchart illustrating a charged particle beam drawing method according to the first embodiment.

First, the gas in the drawing chamber 103a and the electronic lens barrel 103b is exhausted using the auxiliary dry pump 220. The gas is further exhausted using the high vacuum pump 221 to maintain a predetermined degree of vacuum (S11).

Next, the ozone supplying apparatus 10 supplies a high concentration ozone gas to the drawing apparatus 101 (S12). The high concentration ozone gas is supplied to the drawing apparatus 101 by the ozone supplying method according to the first embodiment.

Next, a charged particle beam is ejected (S13). At this time, the beam is controlled by the blanking control mechanism 224 not to irradiate the inside of the drawing chamber 103a.

Then, the object 105, which is subjected to drawing, is mounted on the XY stage 104 in the drawing chamber 103a using a transfer system not illustrated (S14).

The ozone supplying method will be described.

The ozone generator 11 generates the ozone gas, and the ozone gas is introduced into the main pipe 12b, with the pressure in the main pipe 12b being controlled to be a constant pressure lower than atmospheric pressure by the first mass flow controller 13. After the ozone gas is introduced into the main pipe 12b, the ozone gas is continuously supplied to the drawing apparatus 101 through the main pipe 12b at a constant flow rate controlled by the second mass flow controller 15. Thus, the ozone supplying apparatus 10 supplies a high concentration ozone gas to the drawing apparatus 101.

Next, the charged particle beam 200 is shaped by the controller 216. Then, the irradiation position is controlled by controlling the main deflector 208 and the sub-deflector 209 using the controller 216, while the position of the XY stage 104 is controlled by the controller 216. Thus, the shot position of the charged particle beam 200 is controlled. Further, the blanking control mechanism 224 is controlled to irradiate the object 105 with the charged particle beam 200 only for a desired period of time (S15). That is, drawing processing for the object 105 is performed while the ozone gas is supplied to the drawing apparatus 101.

When the drawing processing is finished, the object 105 is unloaded from the drawing apparatus 101 (S16).

The charged particle beam drawing system 1 thus performs the charged particle beam drawing of the object 105.

In the charged particle beam drawing method and the ozone supplying method described above, the concentration of the ozone gas supplied to the drawing apparatus 101 changes according to average stay-time T min of the ozone gas in the main pipe 12b. As the average stay-time T is shortened, a higher concentration ozone gas can be supplied to the drawing apparatus 101.

The average stay-time T of the ozone gas in the main pipe 12b is calculated by the following expression.

$$T = \text{primary pressure (the pressure in the pipe) (atm)} \times \text{pipe capacity (cc)/amount of ozone gas used (sccm)}$$

It is found from the above expression that the average stay-time T of the ozone gas in the main pipe 12b is shortened according to the decrease of the primary pressure, on the condition that the capacity of the main pipe 12b and the amount of the ozone gas used are fixed. In the past, the mass flow controller has not been provided on the upstream side of the main pipe, and the pressure of the ozone gas in the main pipe is based on the pressure of the ozone gas supplied directly from the ozone generator. The pressure of the ozone gas in the main pipe is, for example, 0.1 MPa (nearly equal to 1 atm) which is higher than the atmospheric pressure. For example, if the capacity of the pipe is 1,000 cc and the amount of the ozone gas used is 1 sccm, the average stay-time T of the ozone gas is $T = 1 \times 1,000/1 = 1,000$ min.

In contrast, in the present embodiment, the first mass flow controller 13 is provided on the upstream side of the main pipe 12b, and the flow rate of the ozone gas is controlled by the first mass flow controller 13 in such a manner that the pressure (primary pressure) in the main pipe 12b is at a constant pressure lower than the atmospheric pressure. If, therefore, the capacity of the pipe is 1,000 cc and the amount of the ozone gas used is sccm, the first mass flow controller 13 controls the flow rate of the ozone gas such that the primary pressure is at a low pressure of, for example, 1,000 Pa (nearly equal to 0.001 atm). Therefore, the average stay-time T of the ozone gas can be $T = 0.001 \times 1,000/1 = 1$ min, which is shorter than in the past.

As described above, according to the present embodiment, the main pipe 12b is provided on the secondary side of the first mass flow controller 13. Therefore, the flow rate of the ozone gas can be controlled such that the pressure in the main pipe 12b is at a low pressure lower than the atmospheric pressure. As a result, the average stay-time T of the ozone gas in the main pipe 12b can be shorter than in the past, and decomposing the ozone gas in the main pipe 12b can be suppressed. Accordingly, the high concentration ozone gas can be supplied to the drawing apparatus 101. By thus supplying the high concentration ozone gas to the drawing apparatus 101, charging and contamination of electrodes in the drawing apparatus 101 can be suppressed.

<Variation>

Figure 4:
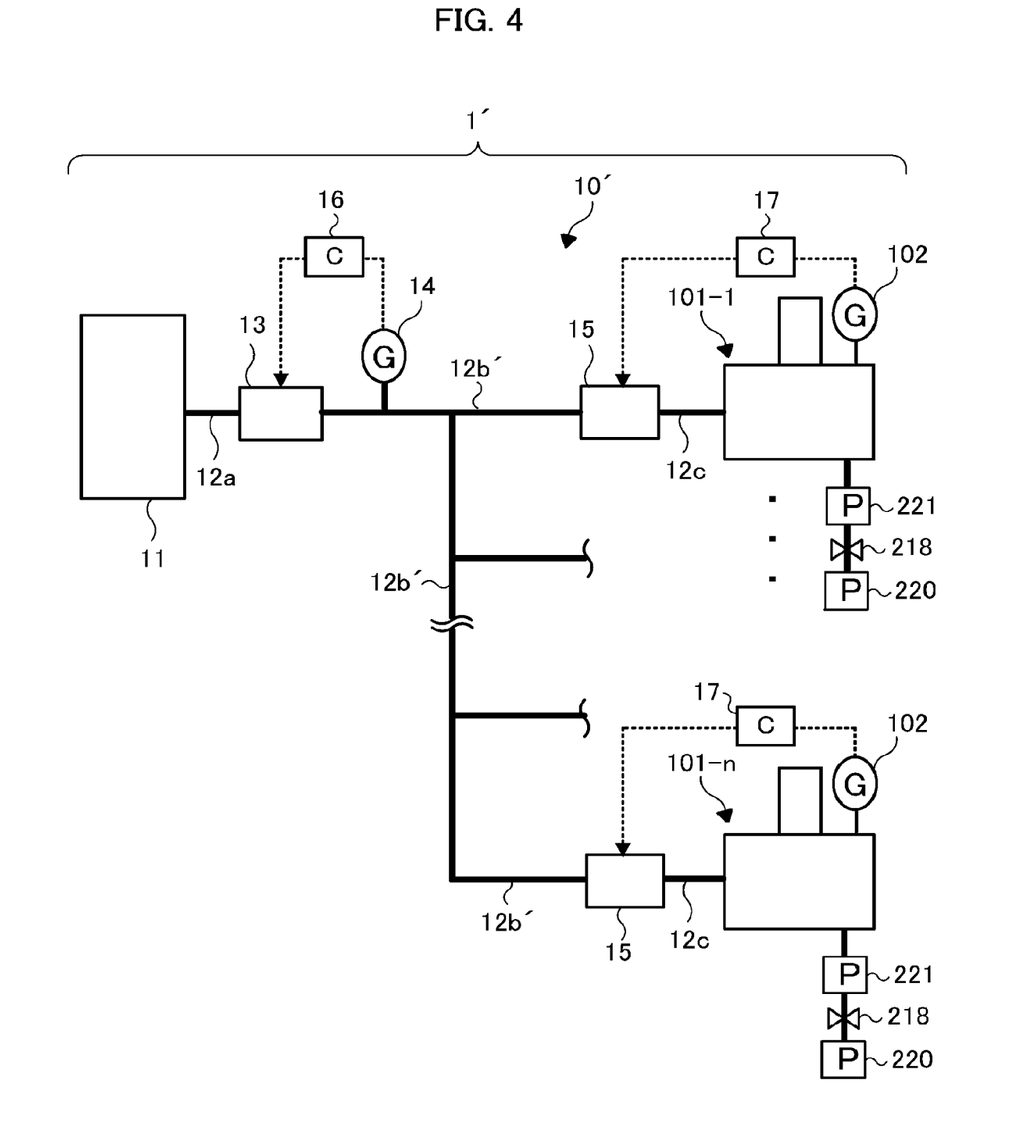
FIG. 4 is a schematic diagram illustrating the structure of a charged particle beam drawing system according to a variation of the first embodiment.

A plurality of drawing apparatuses 101-1 to 101-n (where n represents an integer equal to or larger than 2 hereinafter) can be connected in parallel with each other to single ozone generator 11. FIG. 4 is a schematic diagram illustrating the structure of a charged particle beam drawing system 1' according to a variation of the first embodiment.

In FIG. 4, an ozone supplying apparatus 10' according to the variation of the first embodiment includes a plurality of drawing apparatuses 101-1 to 101-n connected in parallel with each other to the single ozone generator 11 with a branched main pipe 12b', which is branched in the middle of the main pipe 12b. In the ozone supplying apparatus 10', a plurality of second mass flow controllers 15 are provided on the upstream side of the drawing apparatuses 101-1 to 101-n, respectively. By thus providing the plurality of second mass flow controllers 15, the flow rate of the ozone gas supplied to each of the drawing apparatuses 101-1 to 101-n can be controlled independently.

Similar to the first embodiment, even when the single ozone generator 11 is used for the plurality of drawing apparatuses 101-1 to 101-n as in this variation, the high concentration ozone gas can be supplied. By supplying the high concentration ozone gas to these drawing apparatuses 101-1 to 101-n, charging and contamination of electrodes in the drawing apparatuses 101-1 to 101-n can be suppressed.

<Second Embodiment>

A structure of the present embodiment is partly similar to that of the first embodiment, except that part of the ozone gas in the main pipe 12b is exhausted.

Figure 5:
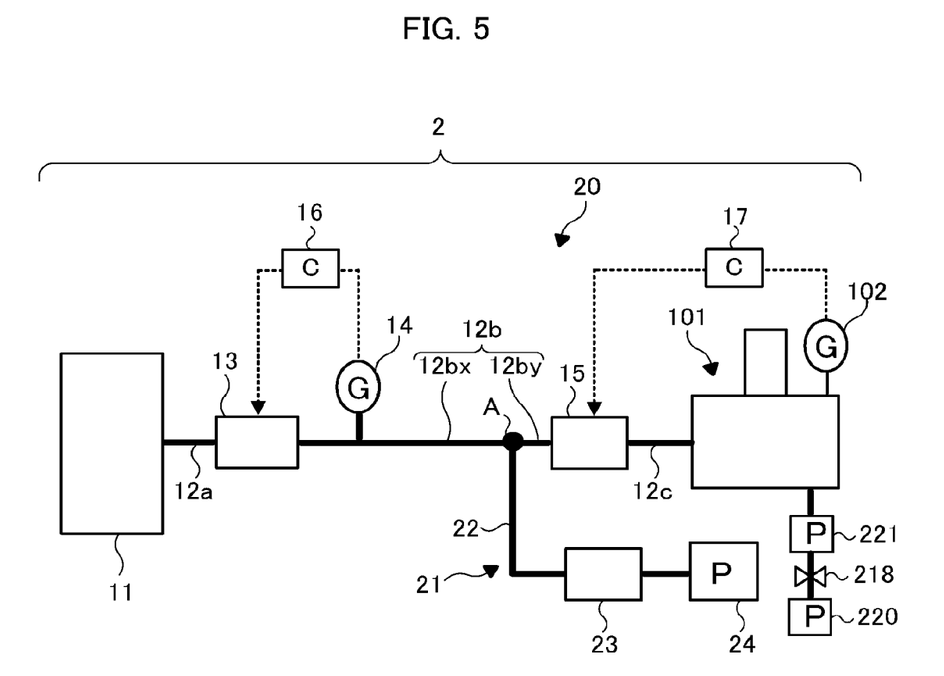
FIG. 5 is a schematic diagram illustrating the structure of a charged particle beam drawing system according to a second embodiment.

FIG. 5 is a schematic diagram illustrating the structure of a charged particle beam drawing system according to a second embodiment. In a charged particle beam drawing system 2 and an ozone supplying apparatus 20 illustrated in FIG. 5, the same reference signs are given to the components similar to those of the charged particle beam drawing system 1 and the ozone supplying apparatus 10 of the first embodiment.

As illustrated in FIG. 5, the charged particle beam drawing system 2 and the ozone supplying apparatus 20 has a first exhaust 21. The first exhaust 21 exhausts part of the ozone gas in the main pipe 12b. In the first exhaust 21, the main pipe 12b is connected to a waste line 22, which is a first sub-pipe constituting a flow path of the ozone gas, at a connection point A. The waste line 22 is a pipe for wasting excessive gas, to which a pump, such as a dry pump 24, may be connected. The ozone gas introduced into the waste line 22 is exhausted by the dry pump 24.

A third mass flow controller 23 that is a third flow control mechanism is connected to the waste line 22. The third mass flow controller 23 is provided on the primary side of the dry pump 24. The third mass flow controller 23 controls the flow rate of the ozone gas such that the ozone gas in the waste line 22 is supplied to the dry pump 24 at a constant flow rate.

At this time, the first exhaust 21 is preferably provided such that a ratio between a first capacity and a second capacity is 800 to 8,000:1. The first capacity is a capacity of an upstream-side main pipe 12$bx$, which is provided between the first mass flow controller 13 and the connection point A. The second capacity is a capacity of a downstream-side main pipe 12$by$, which is provided between the connection point A and the second mass flow controller 15. The term "capacity" as used herein will hereinafter indicate a volume in the main pipe 12$b$.

The upstream-side main pipe 12$bx$ and the downstream-side main pipe 12$by$ of the main pipe 12$b$ used in the present embodiment are provided to have an inner diameter ratio of 2:1. The upstream-side main pipe 12$bx$ has a length of 10 m to 100 m and the downstream-side main pipe 12$by$ has a length equal to or shorter than 50 mm in the first exhaust 21.

By providing the first exhaust 21 such that the ratio between the first capacity of the upstream-side main pipe 12$bx$ and the second capacity of the downstream-side main pipe 12$by$ is 800 to 8,000:1, the stay-time of the ozone gas in the downstream-side main pipe 12$by$ can be decreased sufficiently. As a result of this, decomposition of the ozone gas in the downstream-side main pipe 12$by$ can be suppressed sufficiently.

An ozone supplying method according to the second embodiment will be described below.

First, after the ozone gas is generated by the ozone generator 11, the ozone gas is supplied to the main pipe 12$b$, with the pressure in the main pipe 12$b$ being controlled to be a constant pressure lower than the atmospheric pressure by the first mass flow controller 13. Part of the ozone gas supplied to the main pipe 12$b$ is exhausted, as excessive gas, from the dry pump 24 through the waste line 22 at a constant flow rate controlled by the third mass flow controller 23. The remaining part of the ozone gas that does not exhausted is continuously supplied to the drawing apparatus 101 at a constant flow rate controlled by the second mass flow controller 15.

Similar to the first embodiment, the charged particle beam drawing is thus performed in the second embodiment where the high concentration ozone is supplied.

In the present embodiment, the amount of the ozone gas to be used is determined by the sum of a supply amount of the ozone gas supplied to the drawing apparatus 101 and a supply amount of the ozone gas exhausted from the dry pump 24. For example, when it is assumed that the supply amount of the ozone gas to be supplied to the drawing apparatus 101 by the second mass flow controller 15 is 1 sccm and the exhaust amount of the ozone gas to be exhausted from the dry pump 24 by the third mass flow controller 23 is 10 sccm, the amount of the ozone gas to be used is 11 sccm. Therefore, when the capacity of the pipe is 1,000 cc and the primary pressure controlled by the first mass flow controller 13 is 1,000 Pa (nearly equal to 0.001 atm), then the average stay-time T of the ozone gas in the main pipe 12$b$ is T=0.002×1,000/11=0.09 min. As a result, the average stay-time T of the ozone gas can be decreased compared to the ozone supplying apparatus 10 according to the first embodiment.

Similar effects as in the first embodiment are obtained in the present embodiment described above. Since the first sub-pipe (waste line 22) with the first exhaust 21 is connected to the main pipe 12$b$, the amount of the ozone gas to be used is increased. The average stay-time T of the ozone gas in the main pipe 12$b$ can further be decreased, and the decomposition of the ozone gas in the main pipe 12$b$ can be further suppressed. Therefore, the high concentration ozone gas can be supplied to the drawing apparatus 101. By supplying the high concentration ozone gas to the drawing apparatus 101 in this manner, the charging and contamination of the electrodes in the drawing apparatus 101 can be suppressed.

<Variation>

Figure 6:
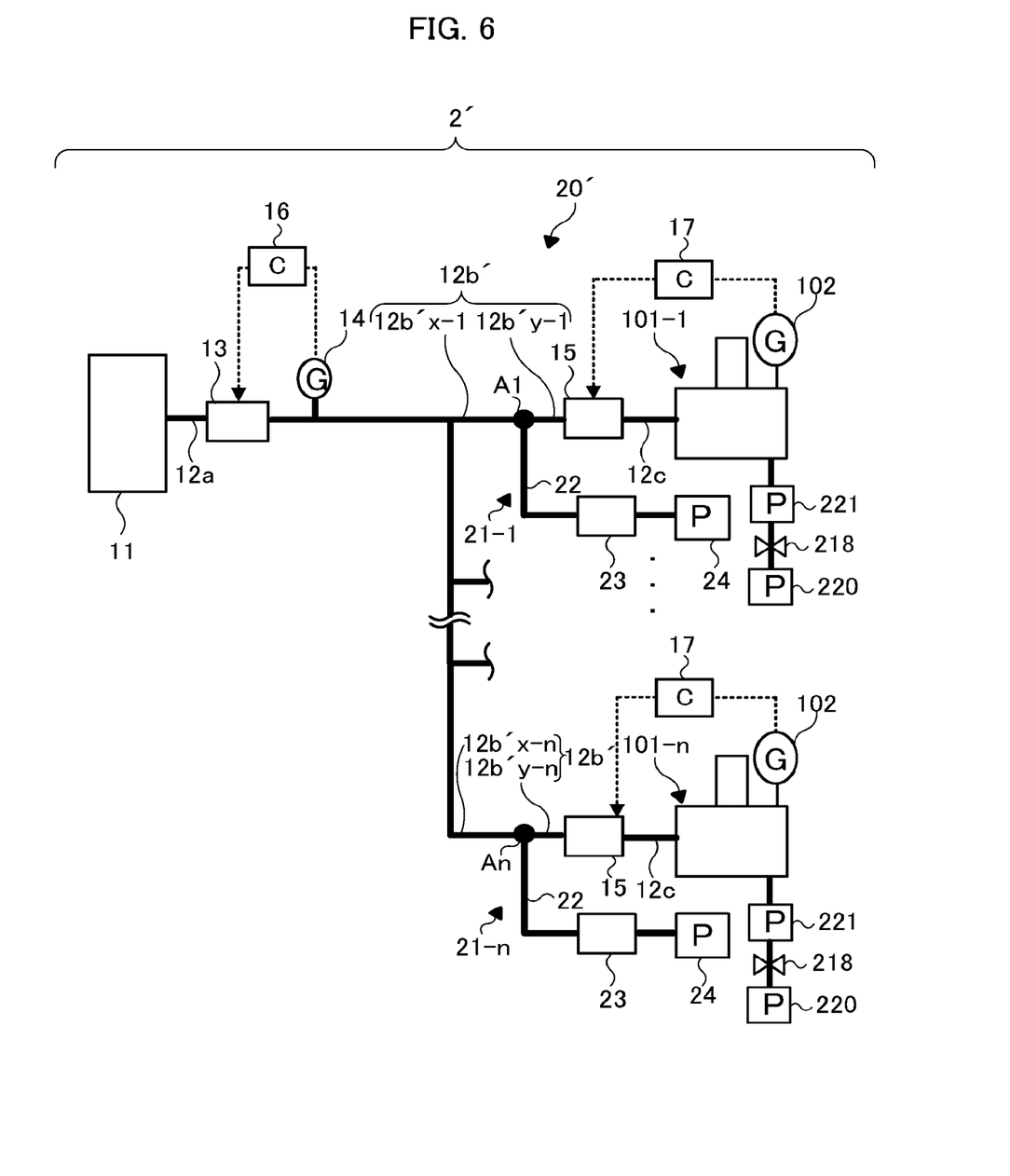
FIG. 6 is a schematic diagram illustrating the structure of a charged particle beam drawing system according to a variation of the second embodiment.

FIG. 6 is a schematic diagram illustrating the structure of a charged particle beam drawing system according to a variation of the second embodiment. As illustrated in FIG. 6, an ozone supplying apparatus 20' according to the variation of the second embodiment includes a branched main pipe 12$b$', which is branched in the downstream side of the main pipe 12$b$. A plurality of drawing apparatuses 101-1 to 101-n is connected in parallel with each other to the ozone generator 11 by the branched main pipe 12$b$'. In this case, a plurality of first exhausts 21-1 to 21-n are provided with the drawing apparatuses 101-1 to 101-n, respectively. The structure of each of the first exhausts 21-1 to 21-n is similar to that of the first exhaust 21 illustrated in FIG. 5.

Similar to the second embodiment, each of the first exhausts 21-1 to 21-n is preferably provided such that the ratio between the first capacity and the second capacity is 800 to 8,000:1. The first capacity is a capacity of each of upstream-side main pipes 12$b$'$x$-1 to 12$b$'$x$-n, each of which is provided between the first mass flow controller 13 and the connection points A1 to An. The second capacity is a capacity of each of downstream-side main pipes 12$b$'$y$-1 to 12$b$'$y$-n, each of which is provided between the connection points A1 to An and the second mass flow controller 15.

In this variation, the ozone is supplied and the charged particle beam drawing is performed as in the second embodiment.

Similar to the variation of the second embodiment, even when the plurality of drawing apparatuses 101-1 to 101-n are used, it is possible to supply the high concentration ozone gas as in the second embodiment. By supplying the high concentration ozone gas to these drawing apparatuses 101-1 to 101-n, the charging and contamination in electrodes in the drawing apparatuses 101-1 to 101-n can be suppressed.

Figure 7:
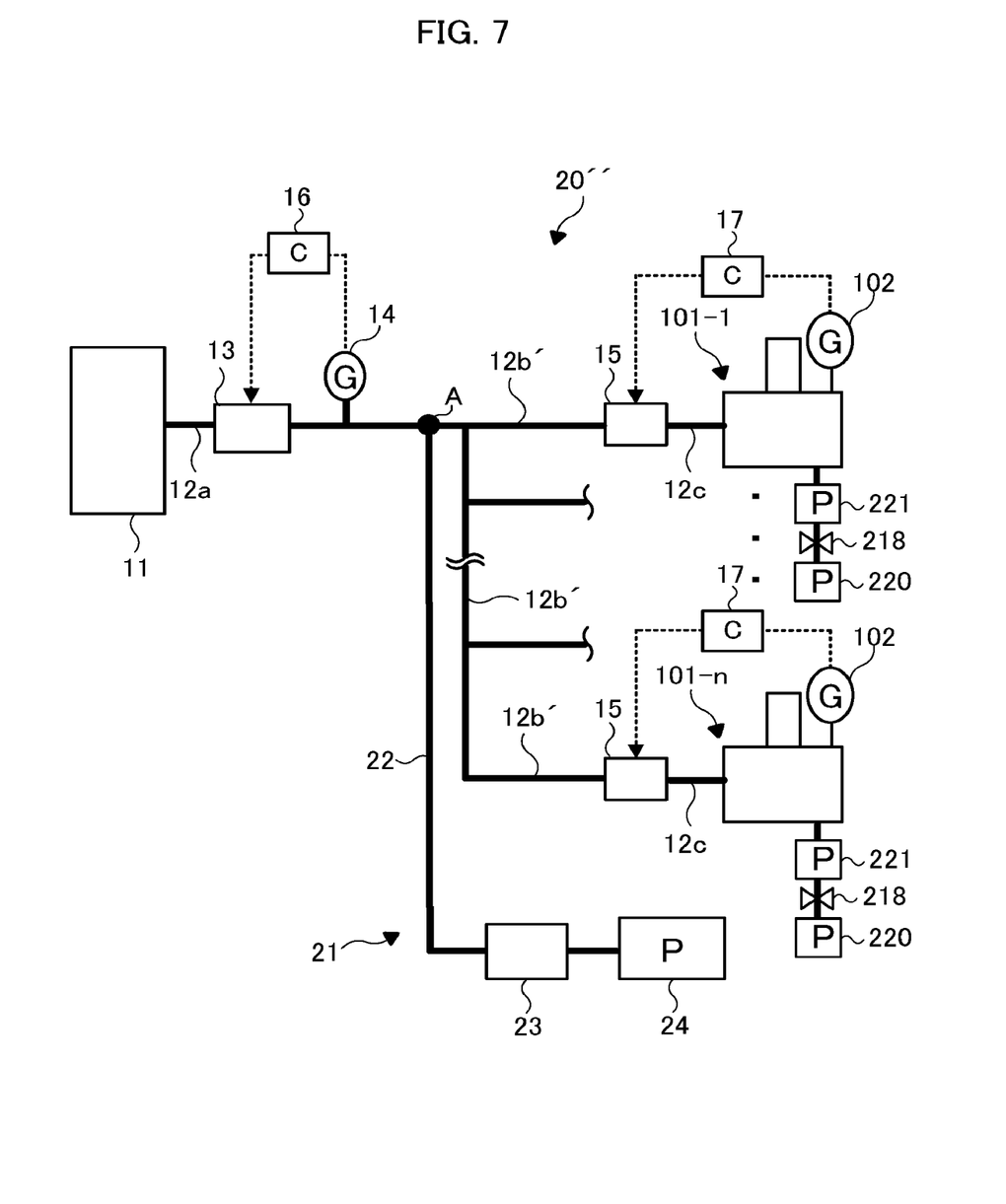
FIG. 7 is a schematic diagram illustrating a variation of the ozone supplying apparatus.

As illustrated in FIG. 7, an ozone supplying apparatus 20" may include a common first exhaust 21 at one location for the plurality of drawing apparatuses 101-1 to 101-n.

<Third Embodiment>

The present embodiment differs from the first and second embodiments in that a buffer container that is inert against ozone gas is provided in the main pipe.

Figure 8:
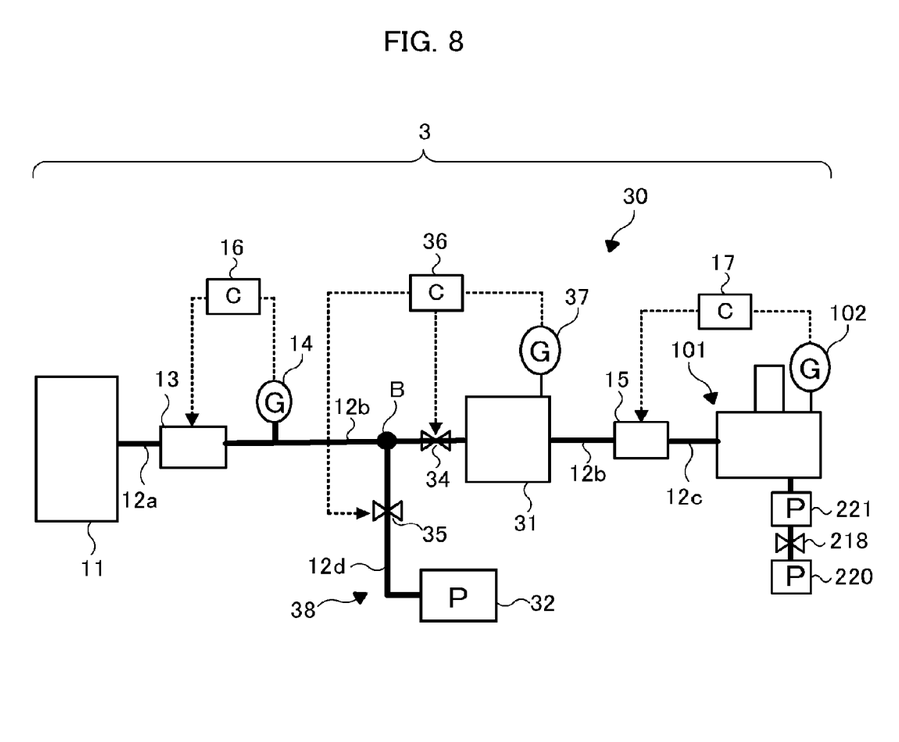
FIG. 8 is a schematic diagram illustrating the structure of a charged particle beam drawing system according to a third embodiment.

FIG. 8 is a schematic diagram illustrating the structure of a charged particle beam drawing system according to a third embodiment. In a charged particle beam drawing system 3 and an ozone supplying apparatus 30 illustrated in FIG. 8, the same reference signs are given to the components similar to those of the charged particle beam drawing system 1 and the ozone supplying apparatus 10 according to the first embodiment.

In the charged particle beam drawing system 3 illustrated in FIG. 8, the ozone supplying apparatus includes a buffer container 31 disposed on the primary side of the second mass flow controller 15 of the main pipe 12$b$. The buffer container 31 is capable of temporarily holding the ozone gas generated in the ozone generator 11. At least the inner surface of the buffer container 31 is treated to be inert against ozone. The treatment to be inert against ozone may include, for example, surface oxidation processing, fluorine resin coating, and so on. A pressure gauge 37 is attached to such a buffer container 31.

Preferably, the buffer container 31 is disposed at a position as close as possible to a drawing apparatus 101 in order to decrease the stay-time of ozone gas in the main pipe 12b between the container and the drawing apparatus 101.

A second sub-pipe 12d is connected to the main pipe 12b at a connection point B. The connection point B is formed on the primary side of the buffer container 31. An third exhaust 38 including a dry pump 32 capable of evacuating the main pipe 12b is connected to the main pipe 12b.

On the main pipe 12b, a first valve 34 is provided between the connection point B of the second sub-pipe 12d and the buffer container 31, and a second valve is provided on the second sub-pipe 12d. A controller 36 can control open-close of the first and second valves 34, 35 according to a detection result of the pressure gauge 37 attached to the buffer container 31. Incidentally, the controller 36 can also be made of processor, for example, ASIC, a circuit device such as a programmable logic device, or the like.

A charged particle beam drawing method according to the third embodiment using the charged particle beam drawing system 3 including the ozone supplying apparatus 30 is similar to the charged particle beam drawing method according to the first embodiment, other than the ozone supplying method. An ozone supplying method according to the third embodiment applied to the charged particle beam drawing method of the third embodiment will be described below.

Figure 9:
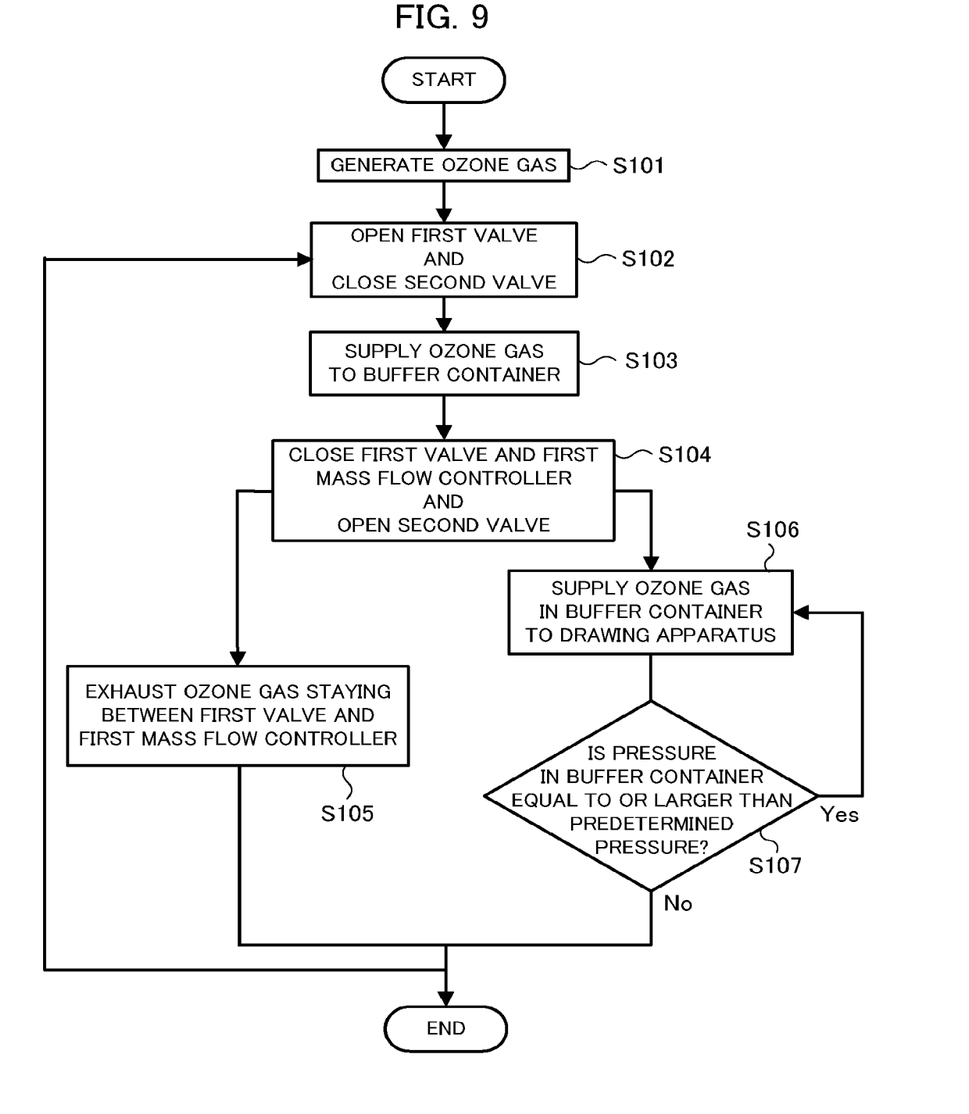
FIG. 9 is a flowchart illustrating an ozone supplying method according to the third embodiment.

In the ozone supplying method according to the third embodiment, a large amount of ozone gas is intermittently supplied to the buffer container 31 and the ozone gas in the buffer container 31 is continuously supplied from the buffer container 31 to the drawing apparatus 101 at a predetermined flow rate. In this method, a large amount of ozone gas is supplied to the buffer container 31 to increase the amount of ozone gas to be used, thereby shorten the stay-time T of the ozone gas in the main pipe 12. The ozone supplying method will be described in detail below by referring to FIG. 9. FIG. 9 is a flowchart illustrating an ozone supplying method according to a third embodiment.

As illustrated in FIG. 9, ozone gas is first generated in the ozone generator 11 (S101), and the controller 36 opens the first valve 34 provided on the main pipe 12b and closes the second valve 35 provided on the second sub-pipe 12d (S102) in order to supply the generated large amount of ozone gas to the buffer container 31.

The generated large amount of ozone gas is supplied to the buffer container 31 by the controller's 16 controlling the first mass flow controller 13 to control the pressure in the main pipe 12b to be a constant pressure lower than the atmospheric pressure, the control controller's 36 opening the first valve 34, and the control controller's 36 closing the second valve 35 (S103).

Next, the controller 36 closes the first valve 34, and the controller 16 controls the first mass flow controller 13 to stop supplying the ozone gas to the main pipe 12. After this, the controller 36 opens the second valve 35 (S104).

The ozone gas in the main pipe 12b between the first valve 34 and the first mass flow controller 13 is then exhausted by the third exhaust 38 (S105).

In the step S104 above, the controller 36 may close the first valve 34 and open the second valve 35. After this, the controller 16 controls the ozone generator 11 so as not to supply the ozone gas from the ozone generator 11. By controlling the ozone generator 11 in this manner, in the step S105, it is possible to exhaust the ozone gas from the main pipe 12b provided between the first valve 34 and the first mass flow controller 13, and also exhaust the ozone gas from the first mass flow controller 13.

The ozone gas in the buffer container 31 is continuously supplied to the drawing apparatus 101 at a flow rate controlled by the second mass flow controller 15 (S106).

The pressure in the buffer container 31 is detected by the pressure gauge 37 attached to the buffer container 31. When the detected pressure is equal to or larger than a predetermined pressure (Yes at S107), the ozone gas in the buffer container 31 is continuously supplied to the drawing apparatus 101 (S106).

If the detected pressure in the buffer container 31 is smaller than the predetermined pressure (No at S107), because the flow of the ozone gas from the buffer container 31 to the drawing apparatus 101 is stopped, the ozone gas needs to be supplied again to the buffer container 31. Therefore, when it is determined by the controller 36 that the detected pressure is smaller than the predetermined pressure, the controller 36 opens the first valve 34 and closes the second valve 35 (S102), and a large amount of ozone gas is supplied to the buffer container 31 (S103).

Thus, the large amount of ozone gas is intermittently supplied to the buffer container 31, and the predetermined amount of ozone gas in the buffer container 31 is continuously supplied to the drawing apparatus 101 from the buffer container 31.

Similar to the first embodiment, the charged particle beam drawing is performed in the present embodiment in which the high concentration ozone is supplied.

In the present embodiment described above, the amount of the ozone gas to be used is determined according to the amount of the ozone gas to be supplied at one time to the buffer container 31. For example, it is assumed that the amount of the ozone gas to be supplied at one time to the buffer container 31 is 100 sccm. In this case, if the capacity of the pipe is 1,000 cc, the primary pressure controlled by the first mass flow controller 13 is 1,000 Pa (nearly equal to 0.001 atm), then an average stay-time T of the ozone gas in the main pipe 12b is T=0.001×1,000/100=0.01 min. Thus, the average stay-time T of the ozone gas can further be decreased compared to the ozone supplying apparatus 10 according to the first embodiment.

In the present embodiment described above, the high concentration ozone gas can be supplied to the drawing apparatus 101 as in the first embodiment. By supplying the high concentration ozone gas to the drawing apparatus 101, the charging and contamination of electrodes in the drawing apparatus 101 can be suppressed.

Further, according to the present embodiment, the temperature rise of the main pipe 12b can also be suppressed. That is, while the ozone gas stays in the main pipe 12b, the temperature of the main pipe 12b may sometimes be raised locally due to the reaction between the main pipe 12b and the ozone gas. However, in the ozone supplying apparatus 30, the ozone supplying method, and the charged particle beam drawing system 3 according to the present embodiment, because the ozone gas is intermittently supplied to the buffer container 31, time when the ozone gas is not present in the main pipe 12 is created. During the time, the main pipe 12b can be cooled. Therefore, the decomposition of the supplied ozone is suppressed.

<Fourth Embodiment>

The present embodiment is similar to the second embodiment, except that the first exhaust which exhausts part of the ozone gas is connected to the second exhaust of the drawing apparatus.

Figure 10:
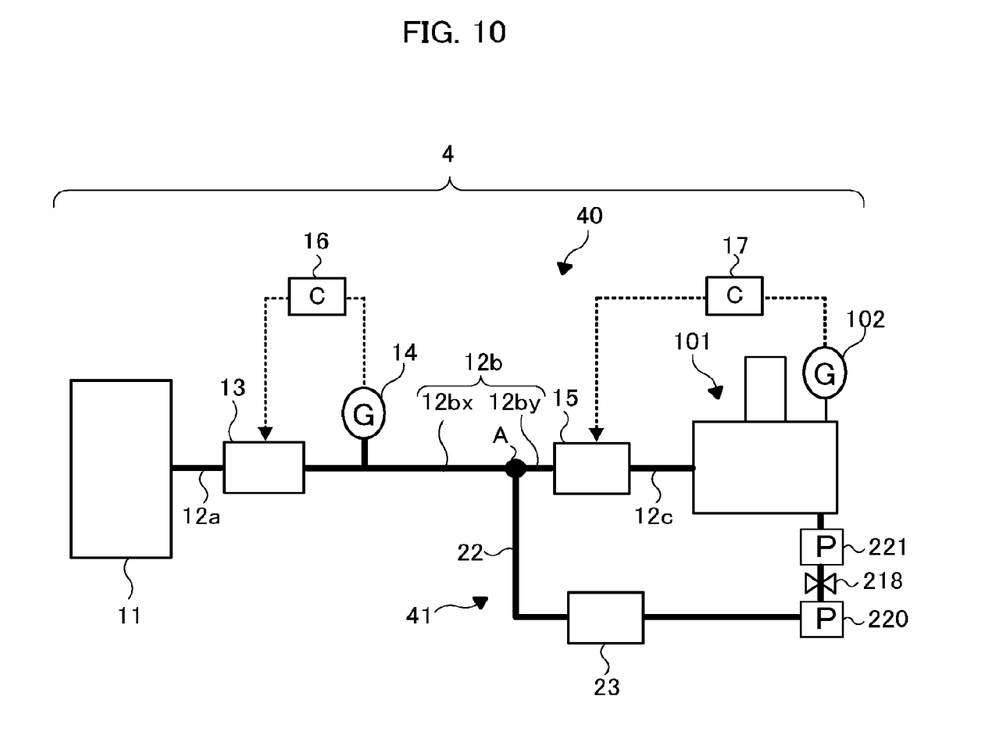
FIG. 10 is a schematic diagram illustrating the structure of a charged particle beam drawing system according to a fourth embodiment.

FIG. 10 is a schematic diagram illustrating the structure of a charged particle beam drawing system 4 according to a fourth embodiment. In the charged particle beam drawing system 4 and an ozone supplying apparatus 40 illustrated in FIG. 10, the same reference signs are given to the components similar to those of the charged particle beam drawing system 2 and the ozone supplying apparatus 20 of the second embodiment.

In the charged particle beam drawing system 4 and the ozone supplying apparatus 40, a first exhaust 41 includes the third mass flow controller 23 provided as a third flow control mechanism and the waste line 22 provided as the first sub-pipe. The first exhaust 41 is connected to the main pipe 12b, similar to the first exhaust 21 illustrated in FIG. 5. The downstream-side end portion of the waste line 22 of the first exhaust 41 is connected to the auxiliary dry pump 220 of a vacuum apparatus exhaust provided as the second exhaust, which is connected to the drawing apparatus 101.

An ozone supplying method by the ozone supplying apparatus 40 according to the fourth embodiment and a charged particle beam drawing method by the charged particle beam drawing system 4 according to the fourth embodiment are similar to the ozone supplying method and the charged particle beam drawing system according to the second embodiment. Therefore, the description thereof will not be repeated.

In the ozone supplying apparatus 40 and the ozone supplying method according to the present embodiment, because the high concentration ozone gas is supplied to the drawing apparatus 101, the charging and contamination of electrodes in the drawing apparatus 101 can be suppressed, similar to the second embodiment.

In addition, the number of dry pumps can be decreased compared to the second embodiment. Therefore, the size and cost of the ozone supplying apparatus 40 and the charged particle beam drawing system 4 can be reduced.

<Variation>

Figure 11:
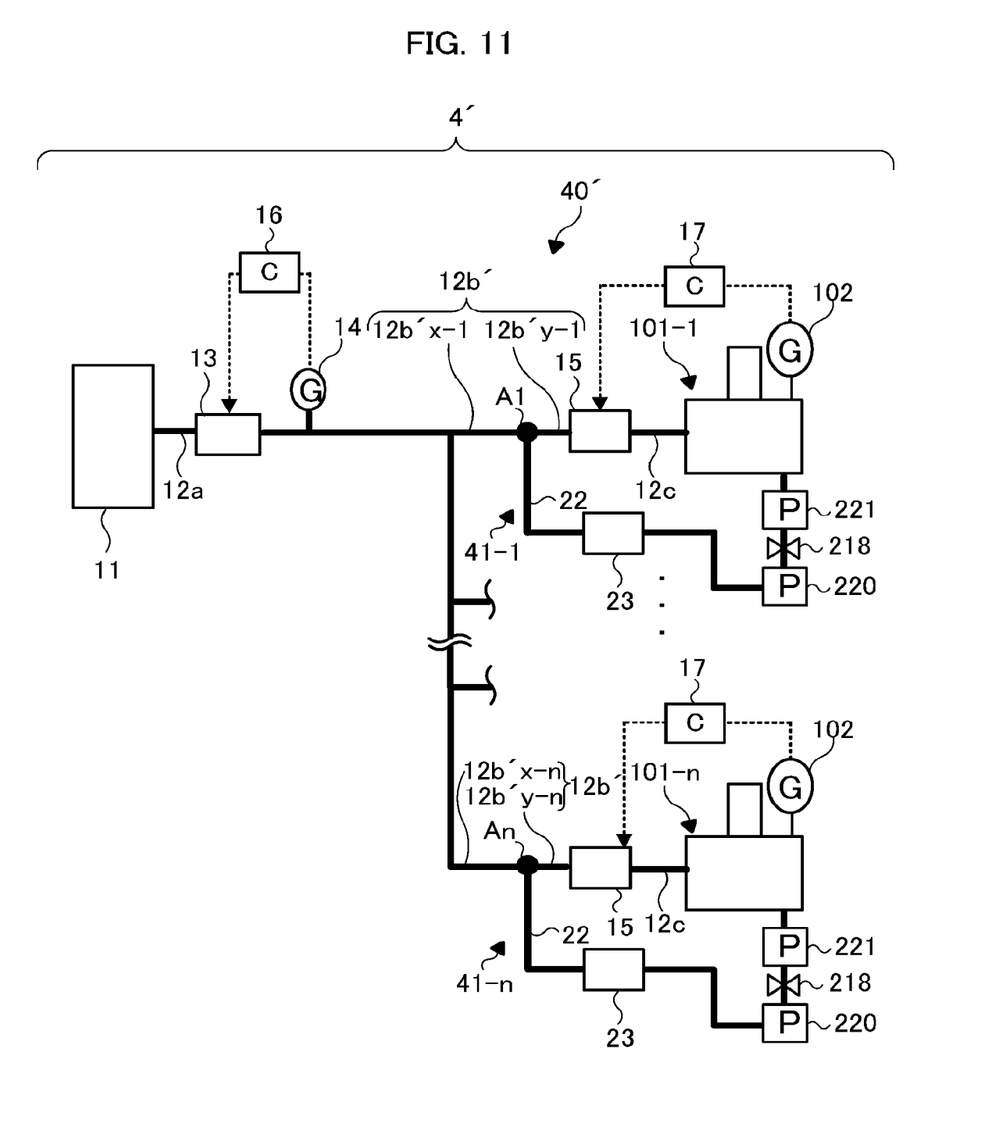
FIG. 11 is a schematic diagram illustrating the structure of a charged particle beam drawing system according to a variation of the fourth embodiment.

FIG. 11 is a schematic diagram illustrating the structure of a charged particle beam drawing system according to a variation of the fourth embodiment. In a charged particle beam drawing system 4' and an ozone supplying apparatus 40' illustrated in FIG. 11, the same reference signs are given to the components similar to those of the charged particle beam drawing system 2' and the ozone supplying apparatus 20' according to the variation of the second embodiment.

Similar to the third embodiment, the number of dry pumps can be largely decreased compared to the variation of the second embodiment in the charged particle beam drawing system 4' and the ozone supplying apparatus 40'. Similarly, the reduction in size and cost can be realized.

Similar to the fourth embodiment, the second sub-pipe 12d on the primary side of the buffer container 31 can be connected to the auxiliary dry pump 220 of the drawing apparatus 101 in the third embodiment and the variation thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, each of the ozone supplying apparatus according to the embodiments described above may be connected to a vacuum apparatus, such as an electron microscope including a scanning electron microscope (SEM), a transmission electron microscope (TEM), etc., other than the drawing apparatus.

What is claimed is:

1. An ozone supplying apparatus which supplies ozone gas to a vacuum apparatus, comprising:
    an ozone generator configured to generate the ozone gas;
    a first flow controller configured to control a flow rate of the ozone gas generated by the ozone generator;
    a second flow controller configured to control a flow rate of the ozone gas supplied to the vacuum apparatus; and
    a main pipe provided on a secondary side of the first flow controller and on a primary side of the second flow controller, with the ozone gas being introduced into the main pipe at such a flow rate that an internal pressure of the main pipe is controlled to be lower than atmospheric pressure by the first flow controller.

2. The ozone supplying apparatus according to claim 1, further comprising:
    a first exhaust provided at a first sub-pipe which is connected to the main pipe at a connection point, the first exhaust configured to exhaust part of the ozone gas that is introduced into the main pipe, at a predetermined flow rate.

3. The ozone supplying apparatus according to claim 2, wherein
    the connection point is provided at a point where a ratio between a first capacity and a second capacity is 800 to 8,000:1, the first capacity is a capacity of a part of the main pipe between the first flow controller and the connection point, and the second capacity is a capacity of a part of the main pipe between the connection point and the second flow controller.

4. The ozone supplying apparatus according to claim 2, wherein
    the first exhaust is connected to a second exhaust that is connected to the vacuum apparatus.

5. The ozone supplying apparatus according to claim 4, further comprising:
    a buffer container being inert against the ozone gas, the buffer container that is connected to the main pipe, the buffer container configured to hold the ozone gas temporarily, and the buffer container configured to supply the ozone gas that is temporarily held in the buffer container to the vacuum apparatus at a flow rate controlled by the second flow controller, and;
    a third exhaust provided on a second sub-pipe which is connected to the main pipe; and
    a controller configured to control the ozone gas to be intermittently introduced into the buffer container from the main pipe, and the controller configured to exhaust the ozone gas staying in the main pipe by the second exhaust when the introduction of the ozone gas into the buffer container is stopped.

6. The ozone supplying apparatus according to claim 1, further comprising:
    a branched main pipe that branched off the main pipe;
    another second flow controller connected to the branched main pipe; and
    another vacuum apparatus connected to the branched main pipe via the other second flow controller.

7. The ozone supplying apparatus according to claim 6, further comprising:
another first exhaust connected to the branched main pipe.

8. The ozone supplying apparatus according to claim 7, wherein
the other first sub-pipe is connected to the other second exhaust which is connected to the other vacuum apparatus.

9. An ozone supplying method, comprising:
generating ozone gas;
introducing the ozone gas into a main pipe by controlling a flow rate of the ozone gas such that an internal pressure of the main pipe is lower than atmospheric pressure; and
supplying at least part of the ozone gas introduced into the main pipe to a vacuum apparatus by controlling the flow rate of the ozone gas.

10. The ozone supplying method according to claim 9, further comprising:
exhausting part of the ozone gas introduced into the main pipe; and
supplying part of the ozone gas that does not exhausted, to the vacuum apparatus by controlling the flow rate of the ozone gas.

11. A charged particle beam drawing system, comprising:
a drawing apparatus irradiating an object with a charged particle beam; and
an ozone supplying apparatus that is connected to the drawing apparatus and the ozone supplying apparatus configured to supply ozone gas to the drawing apparatus;
wherein
the ozone supplying apparatus includes
an ozone generator configured to generate the ozone gas,
a first flow controller configured to control a flow rate of the ozone gas generated by the ozone generator,
a second flow controller configured to control the flow rate of the ozone gas supplied to the drawing apparatus, and
a main pipe provided on a secondary side of the first flow controller and on a primary side of the second flow controller, with the ozone gas being introduced into the main pipe at such a flow rate that an internal pressure of the main pipe is controlled to be lower than atmospheric pressure by the first flow controller.

12. The charged particle beam drawing system according to claim 11, further comprising:
a first exhaust provided at a first sub-pipe which is connected to the main pipe at a connection point, the first exhaust configured to exhaust part of the ozone gas that is introduced into the main pipe, at a predetermined flow rate.

13. The charged particle beam drawing system according to claim 12, wherein
the connection point is provided at a point where a ratio between a first capacity and a second capacity is 800 to 8,000:1, the first capacity is a capacity of a part of the main pipe between the first flow controller and the connection point, and the second capacity is a capacity of a part of the main pipe between the connection point and the second flow controller.

14. The charged particle beam drawing system according to claim 12, wherein
the first exhaust is connected to a second exhaust that is connected to the drawing apparatus.

* * * * *